(12) United States Patent
Gao et al.

(10) Patent No.: US 7,989,363 B2
(45) Date of Patent: Aug. 2, 2011

(54) METHOD FOR RAPID THERMAL TREATMENT USING HIGH ENERGY ELECTROMAGNETIC RADIATION OF A SEMICONDUCTOR SUBSTRATE FOR FORMATION OF DIELECTRIC FILMS

(75) Inventors: David Gao, Shanghai (CN); Mieno Fumitake, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 236 days.

(21) Appl. No.: 12/259,095

(22) Filed: Oct. 27, 2008

(65) Prior Publication Data
US 2010/0009528 A1 Jan. 14, 2010

(30) Foreign Application Priority Data

Jul. 8, 2008 (CN) .......................... 2008 1 0040368

(51) Int. Cl.
*H01L 21/31* (2006.01)
(52) U.S. Cl. ............... 438/787; 438/788; 257/E21.271; 257/E21.282; 257/E21.284; 257/E21.301
(58) Field of Classification Search ............... 438/787, 438/788, 770, 771, 773; 257/E21.271, E21.282, 257/E21.284, E21.301, E21.328
See application file for complete search history.

(56) References Cited

U.S. PATENT DOCUMENTS

| | | | | |
|---|---|---|---|---|
| 6,319,759 | B1 | 11/2001 | Furukawa et al. | |
| 6,573,161 | B1 | 6/2003 | Miyasaka et al. | |
| 7,118,968 | B2 * | 10/2006 | Hsieh | 438/261 |
| 7,271,458 | B2 * | 9/2007 | Chui et al. | 257/410 |
| 7,554,161 | B2 * | 6/2009 | Ahn et al. | 257/368 |
| 7,710,765 | B2 * | 5/2010 | Hanafi | 365/156 |
| 2007/0087505 | A1 * | 4/2007 | Thakur | 438/257 |
| 2007/0212896 | A1 * | 9/2007 | Olsen et al. | 438/758 |
| 2008/0012065 | A1 * | 1/2008 | Kumar | 257/324 |
| 2008/0023732 | A1 * | 1/2008 | Felch et al. | 257/288 |

FOREIGN PATENT DOCUMENTS

EP 0196155 A2 10/1986
* cited by examiner

*Primary Examiner* — Hsien-ming Lee
(74) *Attorney, Agent, or Firm* — Kilpatrick Townsend and Stockton LLP

(57) ABSTRACT

A method for fabricating semiconductor devices, e.g., SONOS cell. The method includes providing a semiconductor substrate (e.g., silicon wafer, silicon on insulator) having a surface region, which has a native oxide layer. The method includes treating the surface region to a wet cleaning process to remove a native oxide layer from the surface region. In a specific embodiment, the method includes subjecting the surface region to an oxygen bearing environment and subjecting the surface region to a high energy electromagnetic radiation having wavelengths ranging from about 300 to about 800 nanometers for a time period of less than 10 milli-seconds to increase a temperature of the surface region to greater than 1000 Degrees Celsius. In a specific embodiment, the method causes formation of an oxide layer having a thickness of less than 10 Angstroms. In a preferred embodiment, the oxide layer is substantially free from pinholes and other imperfections. In a specific embodiment, the oxide layer is a gate oxide layer.

18 Claims, 5 Drawing Sheets

METHOD FOR RAPID THERMAL TREATMENT USING HIGH ENERGY ELECTROMAGNETIC RADIATION OF A SEMICONDUCTOR SUBSTRATE FOR FORMATION OF DIELECTRIC FILMS

CROSS-REFERENCE TO RELATED APPLICATIONS

This application claims priority to Chinese Application No. 200810040368.5, filed Jul. 8, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method for treatment of a surface region of a semiconductor substrate for dielectric material growth for a MOS transistor device, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of a process that has limitations based upon a given feature size is the formation of dielectric materials for MOS transistor devices. Such dielectric materials are often formed for devices having a design rule of 90 nanometers and less. These dielectric materials, including silicon dioxide, are often formed for gate insulating layers for MOS transistor devices or memory device structures such as Silicon-Oxide-Nitride-Oxide-Silicon (SONOS) cells. Unfortunately, it is often difficult to form high quality oxide materials using conventional technologies. That is, difficulties arise in making each of these dielectric materials as device sizes decrease. These and other limitations of conventional dielectric structures can be found throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method for treatment of a surface region of a semiconductor substrate for dielectric material growth for a MOS transistor device, but it would be recognized that the invention has a much broader range of applicability.

In a specific embodiment, the present invention provides a method for fabricating semiconductor devices, e.g., SONOS. The method includes providing a semiconductor substrate (e.g., silicon wafer, silicon on insulator) having a surface region, which has a native oxide layer. The method includes treating the surface region to a wet cleaning process to remove a native oxide layer from the surface region. In a specific embodiment, the method includes subjecting the surface region to an oxygen bearing environment and subjecting the surface region to a high energy electromagnetic radiation having wavelengths ranging from about 300 to about 800 nanometers for a time period of less than 10 milli-seconds to increase a temperature of the surface region to greater than 1000 Degrees Celsius. In a specific embodiment, the method causes formation of an oxide layer having a thickness of less than 10 Angstroms. In a preferred embodiment, the oxide layer is substantially free from pinholes and other imperfections. In a specific embodiment, the oxide layer is a gate oxide layer. Optionally, the method includes removing the high energy electromagnetic radiation to cause a reduction in temperature of about 300 to about 600 Degrees Celsius in a time of about 1 second and less.

In an alternative specific embodiment, the present invention provides an alternative method for fabricating semiconductor devices, SONOS. The method includes providing a semiconductor substrate having a surface region, which has a native oxide layer. In a specific embodiment, the method includes treating the surface region to a wet cleaning process to remove a native oxide layer from the surface region. In a specific embodiment, the method also includes subjecting the surface region to an oxygen bearing environment, e.g., oxygen species. In a specific embodiment, the method includes subjecting the surface region to a high energy electromagnetic radiation having wavelengths ranging from about 300 to about 800 nanometers for a time period of less than 10 milli-seconds to increase a temperature of the surface region to greater than 1000 Degrees Celsius to cause formation of a oxide layer having a thickness of less than 10 Angstroms. In a preferred embodiment, the oxide layer is substantially free from pinholes and other imperfections. In a specific embodiment, the method includes forming a nitride layer overlying the oxide layer and forming an oxide layer overlying the nitride layer to provide an oxide on nitride on oxide stack structure. In a preferred embodiment, the method also includes forming a gate structure (e.g., control gate) overlying the oxide on nitride on oxide stack structure.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for a rapid thermal treatment process that reduces a thermal budget of the integrated circuit device according to a specific embodiment. Depending upon the embodiment, one or more of these benefits may be achieved. These and other benefits will be described in more throughout the present specification and more particularly below.

DETAILED DESCRIPTION OF THE INVENTION

According to the present invention, techniques for processing integrated circuits for the manufacture of semiconductor devices are provided. More particularly, the invention provides a method for treatment of a surface region of a semiconductor substrate for dielectric material growth for a MOS transistor device, but it would be recognized that the invention has a much broader range of applicability.

Figure 1:
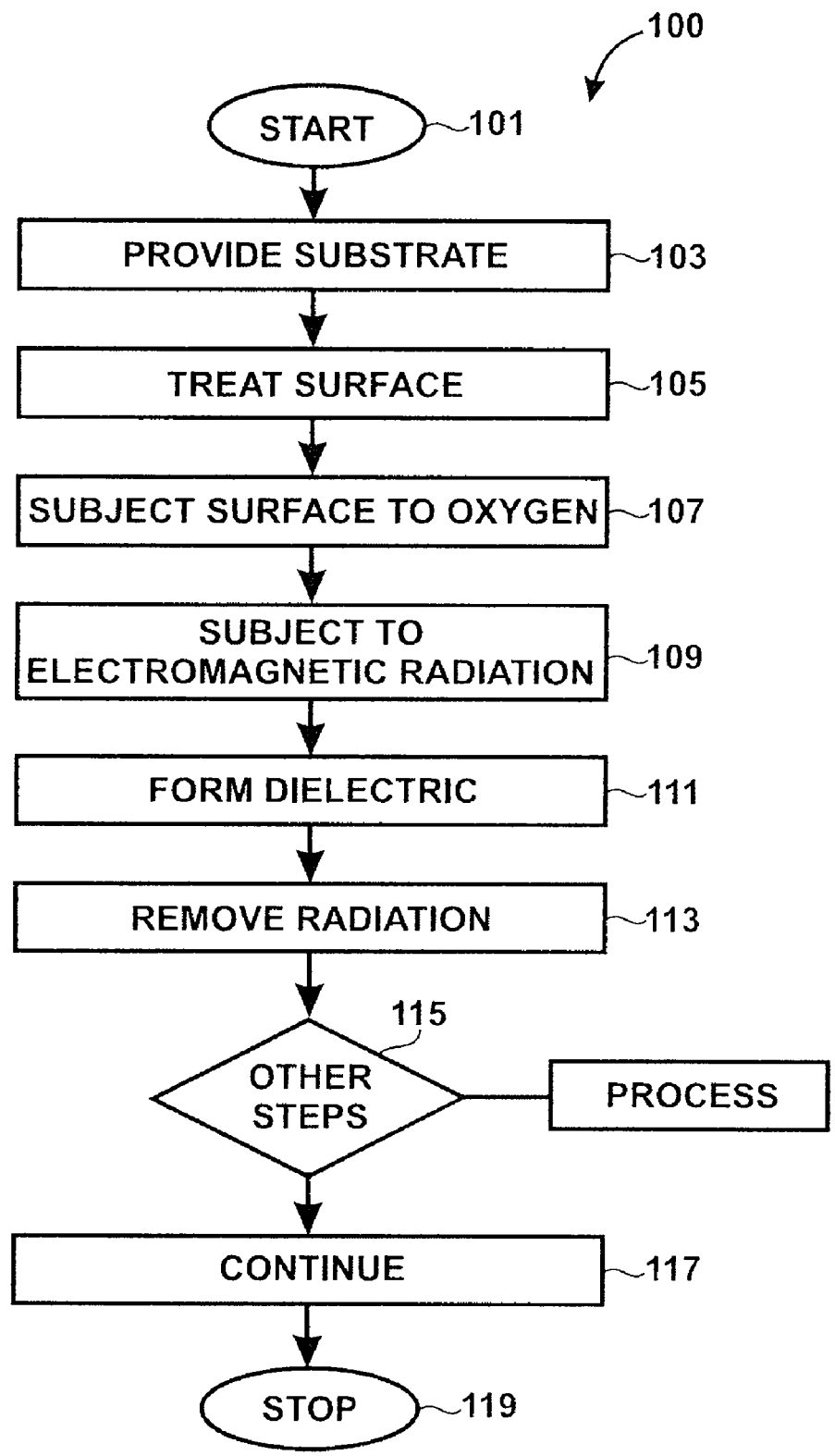
FIG. 1 is a simplified flow diagram of a method of rapid thermal processing according to an embodiment of the present invention.

Referring to FIG. 1 in a specific embodiment, the present invention provides a method (100) for treating a surface region for formation of a dielectric material that can be outlined as follows:

1. Begin a process, step 101;
2. Provide (step 103) a semiconductor substrate (e.g., silicon wafer, silicon on insulator) having a surface region, which has a native oxide layer;
3. Treat the surface region (step 105) to a wet cleaning process to remove a native oxide layer from the surface region;
4. Subject (step 107) the surface region to an oxygen bearing environment;
5. Subject (in preferred embodiments simultaneously with step 4) (step 109) the surface region to a high energy electromagnetic radiation having wavelengths ranging from about 300 to about 800 nanometers for a time period of less than 10 milli-seconds to increase a temperature of the surface region to greater than 1000 Degrees Celsius;
6. Cause formation (step 111) of an oxide layer having a thickness of less than 10 Angstroms and being substantially free from pinholes and other imperfections;
7. Remove (step 113) the high energy electromagnetic radiation to cause a reduction in temperature of about 300 to about 600 Degrees Celsius in a time of about 1 second and less;
8. Perform other steps (step 115), as desired;
9. Continue (step 117) the other steps; and
10. Stop, step 119.

The above sequence of steps provides a method according to an embodiment of the present invention. As shown, the method uses a combination of steps including a way of forming an integrated circuit device such as an MOS device for a CMOS integrated circuit. As shown, the method includes using a rapid thermal process for formation of a dielectric material according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 2:
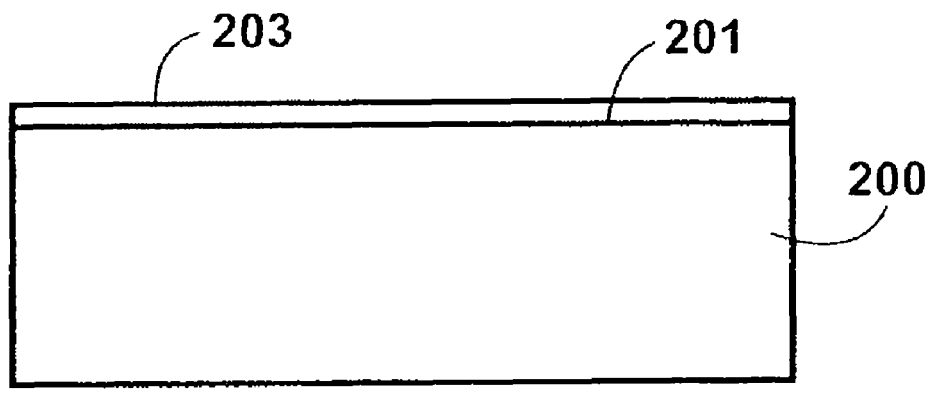
FIGS. 2 and 3 illustrate a simplified method of rapid thermal processing to remove contaminants according to an embodiment of the present invention.
Figure 3:
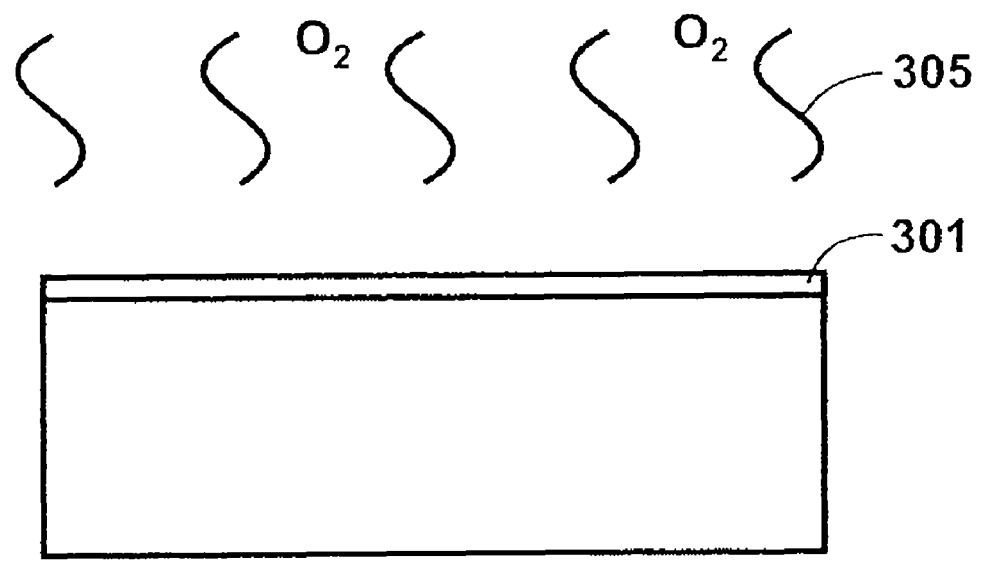

FIGS. 2 and 3 illustrate a simplified method of rapid thermal processing to form a dielectric layer according to an embodiment of the present invention. These diagrams are merely examples, which should not unduly limit the scope of the claims herein. One of ordinary skill in the art would recognize many variations, modifications, and alternatives. As shown, the present invention provides a method for fabricating semiconductor devices, e.g., SONOS. In a specific embodiment, the method includes providing a semiconductor substrate (e.g., silicon wafer, silicon on insulator) having a surface region, which has a native oxide layer. In a specific embodiment, the native oxide can be a thin layer of silicon dioxide or other like species. Of course, there can be other variations, modifications, and alternatives.

In a specific embodiment, the method includes treating the surface region to a wet cleaning process to remove a native oxide layer from the surface region. In a specific embodiment, the wet treatment process can include a hydrofluoric acid dip and/or other fluorine based treatment. In a preferred embodiment, other wet cleaning processes can be used. Of course, there can be other variations, modifications, and alternatives.

In a specific embodiment, the method includes subjecting the surface region to an oxygen bearing environment, as illustrated by the simplified diagram of FIG. 3. In a specific embodiment, the oxygen bearing environment can be gaseous oxygen, water, water vapor, or other suitable species. In a specific embodiment, the oxygen can be mixed with nitrogen and/or argon. Of course, there can be other variations, modifications, and alternatives.

Referring again to FIG. 3, the method subjects the surface region to a high energy electromagnetic radiation 305 having wavelengths ranging from about 300 to about 800 nanometers for a time period of less than 10 milli-seconds to increase a temperature of the surface region to greater than 1000 Degrees Celsius. In a specific embodiment, the method causes formation of an oxide layer having a thickness of less than 10 Angstroms. In a preferred embodiment, the oxide layer is substantially free from pinholes and other imperfections. In a specific embodiment, the radiation can be derived from a flash lamp, laser, or other irradiation source, e.g., rapid thermal treatment process. Of course, there can be other variations, modifications, and alternatives.

In a specific embodiment, the oxide layer is a gate oxide layer. That is, the gate oxide layer can be about 80 Angstroms and less according to a specific embodiment. The gate oxide layer can be used in a stack configuration, which will be described in more detail below. Optionally, the method includes removing the high energy electromagnetic radiation to cause a reduction in temperature of about 300 to about 600 Degrees Celsius in a time of about 1 second and less. In a specific embodiment, the reduction in temperature is rapid and does not lead to damage of the silicon wafer and/or other structures. Of course, there can be other variations, modifications, and alternatives.

The above sequence of steps provides a method according to an embodiment of the present invention. As shown, the method uses a combination of steps including a way of forming an integrated circuit device such as an MOS device for a CMOS integrated circuit. As shown, the method includes using a rapid thermal process for formation of a dielectric material according to a specific embodiment. Other alternatives can also be provided where steps are added, one or more steps are removed, or one or more steps are provided in a different sequence without departing from the scope of the claims herein.

Figure 4:
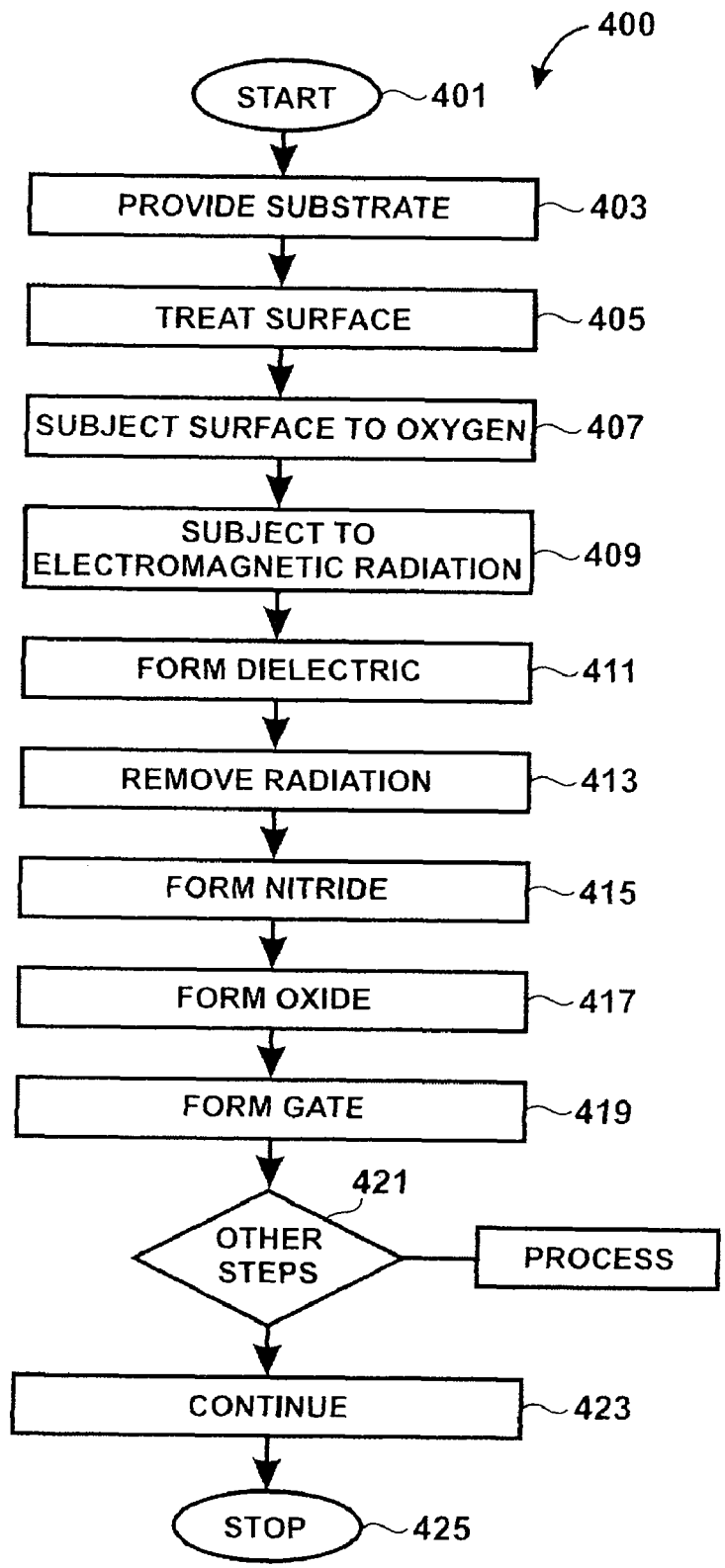
FIG. 4 is a simplified flow diagram of an alternative method of rapid thermal processing according to an alternative embodiment of the present invention.
Figure 5:
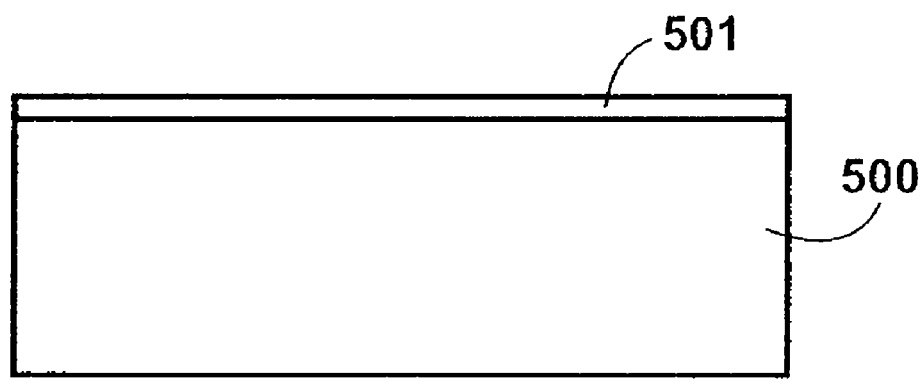
FIGS. 5 through 8 illustrate a simplified method of fabricating an integrated circuit device using a rapid thermal processing method according to an embodiment of the present invention.

Referring to FIG. 4, in an alternative specific embodiment, the present invention provides a method (100) for fabricating SONOS semiconductor devices, which has been outlined below.

1. Begin a start, step 401;
2. Provide (step 403) a semiconductor substrate (e.g., silicon wafer, silicon on insulator) having a surface region, which has a native oxide layer;
3. Treat the surface region (step 405) to a wet cleaning process to remove a native oxide layer from the surface region;
4. Subject (step 407) the surface region to an oxygen bearing environment;
5. Subject (in preferred embodiments simultaneously with step 4) (step 409) the surface region to a high energy electromagnetic radiation having wavelengths ranging from about 300 to about 800 nanometers for a time period of less than 10 milli-seconds to increase a temperature of the surface region to greater than 1000 Degrees Celsius;
6. Cause formation (step 411) of an oxide layer having a thickness of less than 10 Angstroms and being substantially free from pinholes and other imperfections;
7. Remove (step 413) the high energy electromagnetic radiation to cause a reduction in temperature of about 300 to about 600 Degrees Celsius in a time of about 1 second and less;
8. Form a nitride layer (step 415) overlying the oxide layer;
9. Form an oxide layer (step 417) overlying the nitride layer to provide an oxide on nitride on oxide stack structure;
10. Form a gate structure (e.g., control gate) (step 419) overlying the oxide on nitride on oxide stack structure;
11. Perform other steps (step 421), as desired;
12. Continue (step 423) the other steps; and
13. Stop, step 425.

The above sequence of steps provides a method according to an embodiment of the present invention. As shown, the method uses a combination of steps including a way of forming an integrated circuit device such as an MOS device for a CMOS integrated circuit. As shown, the method includes using a rapid thermal process for removal and/or reduction of contaminants according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 5 through 8 illustrate a simplified method of fabricating an integrated circuit device using a rapid thermal processing method according to an embodiment of the present invention. These diagrams are merely examples, which should not unduly limit the scope of the claims herein. One of ordinary skill in the art would recognize many variations, modifications, and alternatives. As shown, the present invention provides a method for fabricating semiconductor devices, e.g., SONas. In a specific embodiment, the method includes providing a semiconductor substrate (e.g., silicon wafer, silicon on insulator) having a surface region, which has a native oxide layer. In a specific embodiment, the native oxide can be a thin layer of silicon dioxide or other like species. Of course, there can be other variations, modifications, and alternatives.

In a specific embodiment, the method includes treating the surface region to a wet cleaning process to remove a native oxide layer from the surface region. In a specific embodiment, the wet treatment process can include a hydrofluoric acid dip and/or other fluorine based treatment. In a preferred embodiment, other wet clearing processes can be used. Of course, there can be other variations, modifications, and alternatives.

Figure 6:
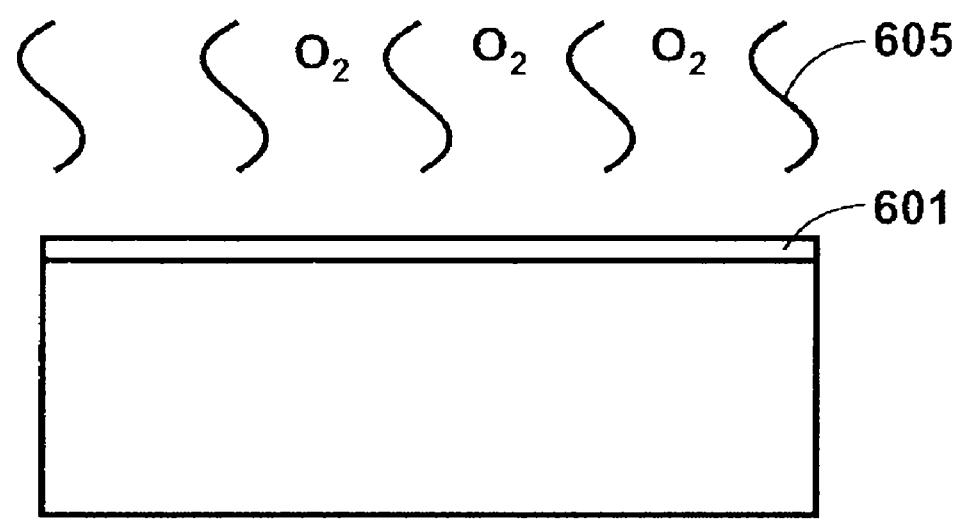

In a specific embodiment, the method includes subjecting the surface region to an oxygen bearing environment, as illustrated by the simplified diagram of FIG. 6. In a specific embodiment, the oxygen bearing environment can be gaseous oxygen, water, water vapor, or other suitable species. In a specific embodiment, the oxygen can be mixed with nitrogen and/or argon. Of course, there can be other variations, modifications, and alternatives.

Referring again to FIG. 6, the method subjects the surface region to a high energy electromagnetic radiation 305 having wavelengths ranging from about 300 to about 800 nanometers for a time period of less than 10 milli-seconds to increase a temperature of the surface region to greater than 1000 Degrees Celsius. In a specific embodiment, the method causes formation of an oxide layer having a thickness of less than 10 Angstroms. In a preferred embodiment, the oxide layer is substantially free from pinholes and other imperfections. In a specific embodiment, the radiation can be derived from a flash lamp, laser, or other irradiation source, e.g., rapid thermal treatment process. Of course, there can be other variations, modifications, and alternatives.

In a specific embodiment, the oxide layer is a gate oxide layer. That is, the gate oxide layer can be about 80 Angstroms and less according to a specific embodiment. The gate oxide layer can be used in a stack configuration, which will be described in more detail below. Optionally, the method includes removing the high energy electromagnetic radiation to cause a reduction in temperature of about 300 to about 600 Degrees Celsius in a time of about 1 second and less. In a specific embodiment, the reduction in temperature is rapid and does not lead to damage of the silicon wafer and/or other structures. Of course, there can be other variations, modifications, and alternatives.

Figure 7:
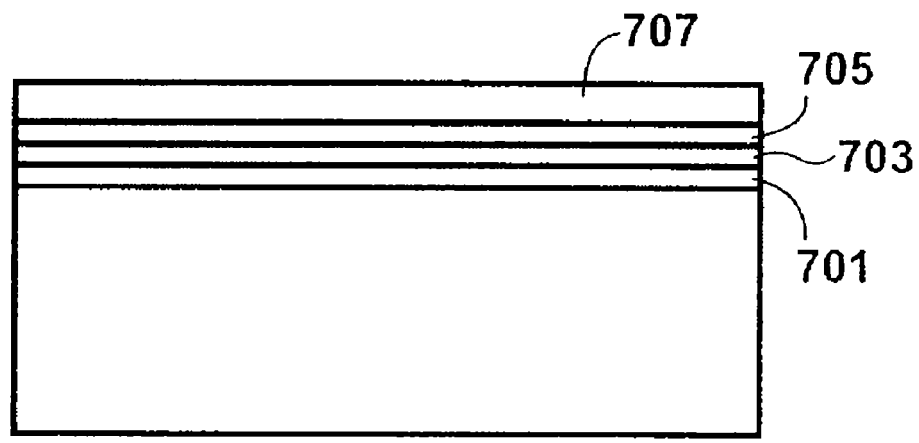

In a specific embodiment, the method continues to form an oxide on nitride on oxide layer stack as illustrated by FIG. 7. As noted, this diagram is merely an example, which should not unduly limit the scope of the claims herein. One of ordinary skill in the art would recognize other variations, modifications, and alternatives. In a specific embodiment, the present method forms a nitride layer overlying the oxide layer. The method forms an oxide layer overlying the nitride layer to provide an oxide on nitride on oxide stack structure. Of course, there can be other variations, modifications, and alternatives.

Figure 8:
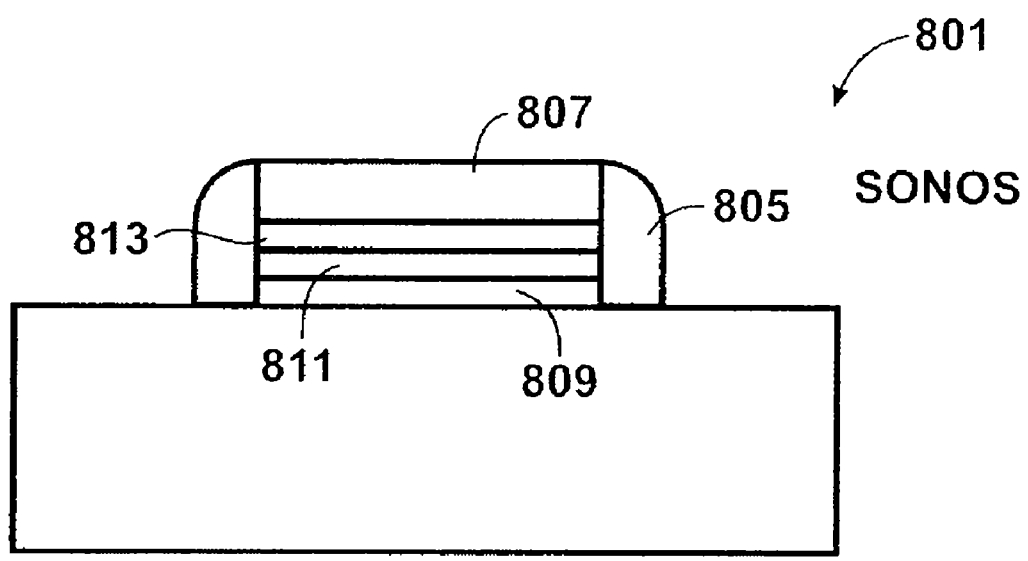

Referring to FIG. 8, the method forms a gate layer overlying the oxide on nitride on oxide stack structure. The method forms a gate structure, e.g., control gate, using a patterning technique. Such patterning technique can include a combination of etching and photolithography steps. In a specific embodiment, the method also forms sidewall spacers on edges of the gate structure, including ONO stack layer. Depending upon the embodiment, the method also includes performing other steps, as desired. Of course, there can be other variations, modifications, and alternatives.

The above sequence of steps provides a method according to an embodiment of the present invention. As shown, the method uses a combination of steps including a way of forming an integrated circuit device such as an MOS device for a CMOS integrated circuit. As shown, the method includes using a rapid thermal process for formation of a dielectric material according to a specific embodiment. Other alternatives can also be provided where steps are added, one or more steps are removed, or one or more steps are provided in a different sequence without departing from the scope of the claims herein.

Although the above has been described in terms of an MOS device, there can be other variations, modifications, and alternatives. It is also understood that the examples and embodiments described herein are for illustrative purposes only and that various modifications or changes in light thereof will be suggested to persons skilled in the art and are to be included within the spirit and purview of this application and scope of the appended claims.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating semiconductor devices, the method comprising:
   providing a semiconductor substrate having a surface region, the surface region having a native oxide layer;
   treating the surface region to a wet cleaning process to remove a native oxide layer from the surface region;
   subjecting the surface region to an oxygen species bearing environment;
   subjecting the surface region to an electromagnetic radiation having wavelengths ranging from about 300 to about 800 nanometers for a time period of less than 10 milli-seconds to increase a temperature of the surface region to greater than 1000 Degrees Celsius;
   causing formation of an oxide layer having a thickness of less than 10 Angstroms, the oxide layer being substantially free from pinholes and imperfections, and
   further comprising removing the electromagnetic radiation to cause a reduction in temperature of about 300 to about 600 Degrees Celsius in a time of about 1 second and less.

2. The method of claim 1 wherein the oxide layer is a gate oxide layer.

3. The method of claim 1 wherein the oxide layer is an interface layer.

4. The method of claim 1 wherein the oxide layer is provided for an oxide on nitride on oxide structure for a SONOS device.

5. The method of claim 1 wherein the oxygen species is mixed with a nitrogen species.

6. The method of claim 1 wherein the oxygen species is mixed with an argon species to form substantially pure silicon dioxide.

7. The method of claim 1 wherein the semiconductor substrate is a silicon wafer.

8. The method of claim 1 wherein the oxide layer is for a device having a design rule of about 45 nanometers and less.

9. The method of claim 1 wherein the surface region is characterized by a depth of less than three microns.

10. A method for fabricating semiconductor devices, the method comprising:
    providing a semiconductor substrate having a surface region, the surface region having a native oxide layer;
    treating the surface region to a wet cleaning process to remove a native oxide layer from the surface region;
    subjecting the surface region to an oxygen species bearing environment;
    subjecting the surface region to an electromagnetic radiation having wavelengths ranging from about 300 to about 800 nanometers for a time period of less than 10 milli-seconds to increase a temperature of the surface region to greater than 1000 Degrees Celsius;
    causing formation of an oxide layer having a thickness of less than 10 Angstroms, the oxide layer being substantially free from pinholes and imperfections;
    removing the electromagnetic radiation to cause a reduction in temperature of about 300 to about 600 Degrees Celsius in a time of about 1 second and less;
    forming a nitride layer overlying the oxide layer;
    forming an oxide layer overlying the nitride layer to provide an oxide on nitride on oxide stack structure; and
    forming a gate structure overlying the oxide on nitride on oxide stack structure.

11. The method of claim 10 wherein the oxide layer is a gate oxide layer.

12. The method of claim 10 wherein the oxide layer is an interface layer.

13. The method of claim 10 wherein the oxide on nitride on oxide structure for a SONOS device.

14. The method of claim 10 wherein the oxygen species is mixed with a nitrogen species.

15. The method of claim 10 wherein the oxygen species is mixed with an argon species to form substantially pure silicon dioxide.

16. The method of claim 10 wherein the semiconductor substrate is a silicon wafer.

17. The method of claim 10 wherein the oxide layer is for a device having a design rule of about 45 nanometers and less.

18. The method of claim 10 wherein the surface region has a depth of less than three microns.

* * * * *